Figure 1A:
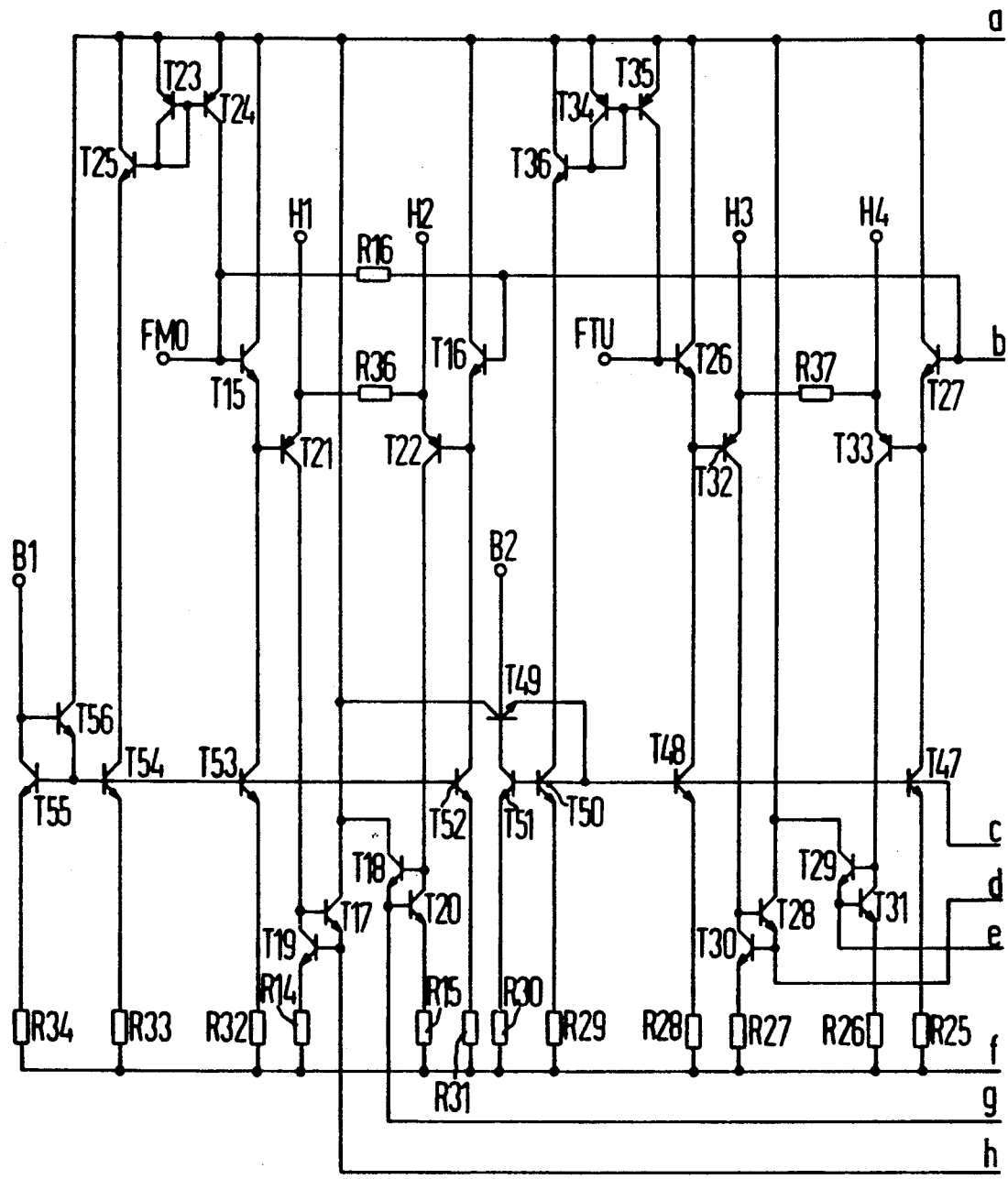
Figure 1B:
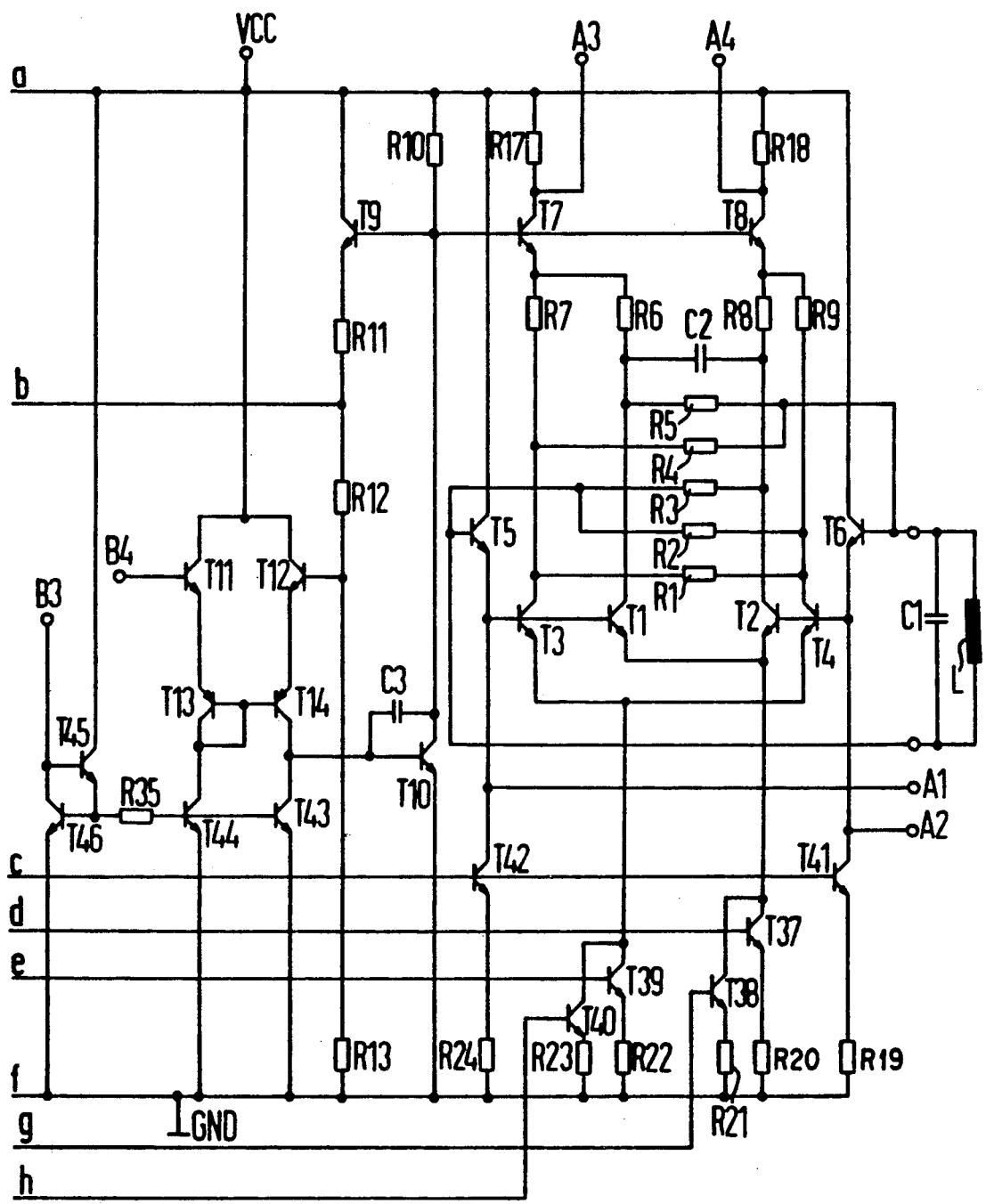

United States Patent [19]

Fenk

[11] Patent Number: 5,198,784
[45] Date of Patent: Mar. 30, 1993

[54] FREQUENCY MODULATED OSCILLATOR HAVING CONTROLLABLE CURRENT SOURCES

[75] Inventor: Josef Fenk, Eching/Ottenburg, Fed. Rep. of Germany

[73] Assignee: Siemens Aktiengesellschaft, Munich, Fed. Rep. of Germany

[21] Appl. No.: 871,043

[22] Filed: Apr. 20, 1992

[30] Foreign Application Priority Data

Apr. 19, 1991 [EP] European Pat. Off. ...... 91 106 336.0

[51] Int. Cl.$^5$ .......................... H03B 5/12; H03C 3/02
[52] U.S. Cl. .......................... 331/117 R; 331/177 R; 332/135
[58] Field of Search ........ 331/117 R, 117 FE, 116 R, 331/116 FE, 177 R; 332/135

[56] References Cited

U.S. PATENT DOCUMENTS

| | | | |
|---|---|---|---|
| 4,055,817 | 10/1977 | Watanabe et al. | 331/117 R |
| 4,533,882 | 8/1985 | Shinbara | 455/42 |
| 4,565,978 | 1/1986 | Fenk et al. | 331/117 R |
| 5,030,927 | 7/1991 | Itoh | 331/116 R |

FOREIGN PATENT DOCUMENTS

| | | |
|---|---|---|
| 0141933 | 5/1985 | European Pat. Off. . |
| 0388890 | 9/1990 | European Pat. Off. . |
| 2131159 | 12/1971 | Fed. Rep. of Germany . |
| 2649745 | 5/1977 | Fed. Rep. of Germany . |
| 3405550 | 8/1984 | Fed. Rep. of Germany . |
| 2120879 | 12/1983 | United Kingdom . |

*Primary Examiner*—Siegfried H. Grimm
*Attorney, Agent, or Firm*—Herbert L. Lerner; Laurence A. Greenberg

[57] ABSTRACT

A frequency modulation oscillator circuit includes an oscillator stage having two emitter-coupled transistor pairs, each being fed from at least one controllable current source, and at least one trigger stage for triggering the controllable current sources for the two transistor pairs.

5 Claims, 2 Drawing Sheets

FREQUENCY MODULATED OSCILLATOR HAVING CONTROLLABLE CURRENT SOURCES

The invention relates to an oscillator circuit.

Frequency modulation oscillator circuits with high frequency constancy and small oscillation amplitude are often needed, particularly for applications in the mobile radio field and in the field of radio and television technology. An oscillator circuit that is preferentially used for such a purpose is known, for instance, from European Patent No. 0 141 933. In that circuit the bases of three constant current sources are located at a terminal for a reference potential. The output of the first constant current source is connected to the emitter of a first transistor and to the base of a second transistor, and the output of the second constant current source is connected to the emitter of a third transistor and the base of a fourth transistor. The emitter of the second transistor and the emitter of the fourth transistor are connected to the output of the third constant current source. The collector of the first transistor and the collector of the third transistor are also connected directly to the terminal for the supply potential, while the collector of the second transistor and the collector of the fourth transistor are each connected to the terminals for the supply potential, by way of a respective resistor. In addition, the base of the first transistor is connected through a resistor to the collector of the fourth transistor, and the base of the third transistor is connected to the collector of the second transistor, through a further resistor. A frequency-defining feedback element, for instance a tuned circuit, is inserted between the base of the third transistor and the base of the first transistor. The oscillator voltage being furnished can be picked up between the emitter of the first transistor and the emitter of the third transistor. The oscillator signal is furnished with the aid of cascade transistors, wherein a first cascade transistor is connected by its emitter to the end of the load resistor belonging to the second transistor that is remote from the second transistor, and another cascade transistor is connected by its emitter to the end of the load resistor belonging to the fourth transistor that is remote from the fourth transistor, and in this way the sole connection between the load resistor and the terminal for the supply potential is provided by connecting the base terminals of the two cascade transistors to a common reference potential and the collector of the two cascade transistors, each using one resistor, to the terminal for the supply potential, so that the oscillator signal to be picked up arises between the collectors of the two cascade transistors.

The connection between the emitters of the second transistor and the fourth transistor and the output of the third constant current source takes place with the help of a fifth transistor, having an emitter located at the output of the constant current source and a collector connected to the emitters of the second and fourth transistors. The emitter of the fifth transistor is also connected, through a fifth resistor, on one hand to the emitter of a sixth transistor and on the other hand to the output of a fourth constant current source, which is connected it to the reference potential. Furthermore, a first terminal of an eigth input to be acted upon by a low frequency signal is provided by the base of a seventh transistor, and a second terminal of said eighth input, to be acted upon by a reference voltage, is provided by the base of an eighth transistor. The emitter of the seventh transistor is located at the output of a fifth constant current source, which is connected by its base to the terminal for the reference potential, and the emitter of the eighth transistor is located at the output of a sixth constant current source, which is connected by its base to the terminal for the reference potential. The emitter of the seventh transistor is also connected to the base of the fifth transistor, and the emitter of the eighth transistor is also connected to the base of the sixth transistor. The collectors of both the seventh and eighth transistor are located directly at the terminal for the supply potential, while the collector of the sixth transistor is located directly at the emitter of a ninth transistor and at the emitter of the tenth transistor. The collectors of the ninth and tenth transistors are also each connected through one load resistor to the terminals for the supply potential. Finally, the collector of the ninth transistor is connected through a further resistor to the base of the third transistor, and the collector of the tenth transistor is connected through a further resistor to the base of the first transistor. A capacitive connection formed by at least one capacitor is provided between the collector of the ninth transistor and the collector of the tenth transistor, and a connection formed by a further resistor is provided between the collectors of the second and fourth transistors.

A disadvantage of the known oscillator circuit is that relatively high operating voltages are needed.

It is accordingly an object of the invention to provide an oscillator, which overcomes the hereinafore-mentioned disadvantages of the heretofore-known devices of this general type, which can be frequency-modulated and which also operates at low operating voltages.

With the foregoing and other objects in view there is provided, in accordance with the invention, an oscillator circuit, comprising an oscillator stage including a first and a second transistor of a first conduction type having emitters being coupled to one another, collectors and bases, a third and a fourth transistor of the first conduction type having emitters being coupled to one another, collectors and bases, the bases of the first and third transistors being coupled to one other, and the bases of the second and fourth transistors being coupled to one another, a fifth transistor of the first conduction type having an emitter connected to the coupled bases of the first and third transistors, a collector connected to a first supply potential and a base forming a terminal, a frequency-determining feedback element connected to the terminal, a sixth transistor of the first conduction type having an emitter connected to the coupled bases of the second and fourth transistors, a collector connected to the first supply potential and a base forming another terminal for the frequency-determining feedback element, a first resistor connected between the collectors of the third and fourth transistors, a second resistor connected between the base of the fifth transistor and the collector of the fourth transistor, a third resistor connected between the base of the fifth transistor and the collector of the second transistor, a fourth resistor connected between the base of the sixth transistor and the collector of the third transistor, and a fifth resistor connected between the base of the sixth transistor and the collector of the first transistor, a seventh and an eighth transistor of the first conduction type having collectors connected to the first supply potential, emitters and bases, a sixth resistor connected between the emitter of the seventh transistor and the collector of the first transistor, and a seventh resistor connected between the emitter of the seventh transistor and the collector of the third transistor, an eighth resistor connected between the emitter of the eighth transistor and the collector of the second transistor, and a ninth resistor connected between the emitter of the eighth transistor and the collector of the fourth transistor, a first current source connected between a second supply potential and the emitter of the fifth transistor, and a second current source connected between the second supply potential and the emitter of the sixth transistor, a ninth transistor of the first conduction type having a collector connected to the first supply potential and a base connected to the bases of the seventh and eighth transistors, a tenth resistor connected between the first supply potential and the base of the ninth transistor, a tenth transistor of the first conduction type having a collector connected to the base of the ninth transistor and an emitter connected to the second supply potential, an eleventh, a twelfth and a thirteenth resistor connected in series between the emitter of the ninth transistor and the second supply potential, the eleventh, twelfth and thirteenth resistors having pickups therebetween, an eleventh and a twelfth transistor of the first conduction type having coupled collectors connected to the first supply potential and having bases, the base of the eleventh transistor being connected to a first bias potential and the base of the twelfth transistor being connected to the pickup between the twelfth and thirteenth resistors, a thirteenth and a fourteenth transistor of the second conduction type having emitters, collectors and bases, the emitter of the thirteenth transistor being connected to the emitter of the eleventh transistor and the emitter of the fourteenth transistor being connected to the emitter of the twelfth transistor, and a third current source connected between the second supply potential and the base and the collector of the thirteenth transistor, and a fourth current source connected between the second supply potential and the fourteenth transistor and the base of the tenth transistor; and at least one trigger stage having a first controllable current source connected between the second supply potential and the coupled emitters of the third and fourth transistors, and a second controllable current source connected between the second supply potential and the coupled emitters of the first and second transistors, the first and second controllable current sources having control inputs, a fifteenth transistor of the first conduction type having a collector connected to the first supply potential, a base forming a signal input, and an emitter, a sixteenth transistor of the first conduction type having a collector connected to the first supply potential, a base connected to the pickup between the eleventh and twelfth resistors, and an emitter, a fifth current source connected between the first operating potential and the emitter of the fifteenth transistor, and a sixth current source connected between the first operating potential and the emitter of the sixteenth transistor, a seventeenth and an eighteenth transistor of the first conduction type having coupled collectors connected to the first supply potential, having emitters each being connected to one of the control inputs of a respective one of the first and second controllable current sources, and having bases, a nineteenth transistor of the first conduction type having a collector connected to the base and a base connected to the emitter of the seventeenth transistor; a twentieth transistor of the first conduction type having a collector connected to the base and a base connected to the emitter of the eighteenth transistor; a twenty-first and a twenty-second transistor of the second conduction type having emitters each being connected to a respective auxiliary potential, bases each being connected to the emitter of a respective one of the fifteenth and sixteenth transistors, and collectors each being connected to the base of a respective one of the seventeenth and eighteenth transistors, and a fourteenth and a fifteenth resistor each being connected between the second supply potential and the emitter of a respective one of the nineteenth and twentieth transistors.

In accordance with another feature of the invention, there is provided at least one twenty-third and at least one twenty-fourth transistor of the second conduction type having emitters connected to the first supply potential, bases connected to one another, and collectors, the collector of the twenty-fourth transistor being coupled to the base of the fifteenth transistor, a twenty-fifth transistor of the first conduction type having a collector connected to the first supply potential and a base connected to the collector and to the base of the twenty-third transistor, and a seventh current source connected between the emitter of the twenty-fifth transistor and the second supply potential.

In accordance with a further feature of the invention, there is provided a sixteenth resistor through which the bases of the fifteenth and sixteenth transistors are coupled to one another, in a trigger stage.

In accordance with an added feature of the invention, there are provided seventeenth and eighteenth resistors each being connected between the first supply potential and the collector of a respective one of the seventh and eighth transistors.

In accordance with a concomitant feature of the invention, the first through seventh current sources are combined into at least one current bank.

Other features which are considered as characteristic for the invention are set forth in the appended claims.

Although the invention is illustrated and described herein as embodied in an oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a schematic circuit diagram of an exemplary embodiment of the invention, which is split along section points a to h into two subfigures 1a and 1b.

Referring now to the single figure of the drawing in detail, there is seen an exemplary embodiment of an oscillator circuit according to the invention which includes one oscillator stage and two trigger stages. The oscillator stage in turn includes two emitter-coupled npn transistors T1 and T2 and two emitter-coupled npn transistors T3 and T4. The emitter of an npn transistor T5 is connected to the coupled bases of the transistors T1 and T3. The collector of the npn transistor T5 is connected to a positive supply potential VCC, while its base is provided as a terminal for a frequency-determining feedback element, which in the present exemplary embodiment is a tuned circuit including a coil L and a capacitor C1. The emitter of an npn transistor T6 is connected to the coupled bases of the transistors T2 and T4 and its collector is connected to the positive supply potential VCC. The base of the npn transistor T6 is provided as a further terminal for the tuned circuit. A resistor R1 is connected between the collectors of the transistors T3 and T4; a resistor R2 is connected between the base of the transistor T5 and the collector of the transistor T4; a resistor R3 is connected between the base of the transistor T5 and the collector of the transistor T2; a resistor R4 is connected between the base of the transistor T6 and the collector of the transistor T3; and a resistor R5 is connected between the base of the transistor T6 and the collector of the transistor T1. Moreover, two npn transistors T7 and T8 have collectors connected to the positive supply potential VCC. Resistors R6 and R7 connect the emitter of the transistor T7 to the collectors of the transistors T1 and T3, respectively, and resistors R8 and R9 connect the emitter of the transistor T8 to the collectors of the transistors T2 and T4, respectively. A negative supply potential GND and the emitters of the transistors T5 and T6 are connected to one another through respective current sources. To this end, the emitter of an npn transistor T42 is connected through a resistor R24 to the negative supply potential GND and the collector of the npn transistor T42 is connected to the emitter of the transistor T5. Similarly, the emitter of an npn transistor T41 is connected through a resistor R19 to the negative supply potential GND and the collector of the npn transistor T41 is connected to the emitter of the transistor T6.

The collector of an npn transistor T9 is connected to the positive supply potential VCC and its base is connected to the bases of the transistors T7 and T8. A resistor R10 is connected between the positive supply potential VCC and the base of the transistor T9. The collector of an npn transistor T10 is connected to the base of the transistor T9, while its emitter is connected to the negative supply potential GND. The collector and the base of the npn transistor T10 are interconnected through a capacitor C3. Three resistors R11, R12 and R13 are connected in series between the emitter of the transistor T9 and the negative supply potential GND. The collectors of two collector-coupled npn transistors T11 and T12 are connected to the positive supply potential VCC and the bases thereof are respectively connected to a bias potential B4 and to a pickup between the resistor R12 and the resistor R13. In addition, the emitters of two pnp transistors T13 and T14 are respectively connected to the emitters of the transistors T11 and T12, and the collectors of the pnp transistors T13 and T14 are each connected through a respective current source to the negative supply potential GND. The two current sources each include one respective npn transistor T44 and T43. Finally, the base and the collector of the transistor T13 are coupled to one another.

The two trigger stages are identical in structure and each includes two controllable current sources, which are connected between the negative supply potential GND and the coupled emitters of the transistors T1, T2 and T3, T4, respectively. The current sources each include one npn transistor T37 to T40, each having a collector being respectively connected to the coupled emitters of the transistors T3, T4 and T1, T2, and an emitter connected through a respective resistor R20 to R23 to the negative supply potential GND. Transistors T15 and T26 have bases provided as control inputs FMO and FTU and collectors which are connected to the positive supply potential VCC. The bases of two transistors T16 and T27 are connected to a pickup between the resistors R11 and R12 and transistors T16 and T27 have collectors connected to the positive supply potential VCC. Each of the emitters of the transistors T15, T16, T26 and T27 are connected through a current source to the negative supply potential GND. These current sources in turn include npn transistors T53, T52, T48, T47 having emitters that are each applied to the negative supply potential GND through a respective resistor R32, R31, R28, R25. The collectors of the npn transistors T53, T52, T48, T47 are each connected to the emitter at a respective one of the associated transistors T15, T16, T26, T27. Sets of two npn transistors T17, T18 and T28, T29, having collectors being coupled in pairs and connected to the positive supply potential VCC, are each connected on the emitter side to a respective one of the bases of the transistors T37 to T40. Each of two npn transistors T19 and T30 has a collector coupled to the base and a base coupled to the emitter of a respective one of the transistors T17 and T28. Correspondingly, each of two npn transistors T20 and T31 has a collector coupled to the base and a base coupled to the emitter of a respective one of the transistors T18 and T29. Finally, respective pnp transistors T21, T22 and T32, T33, having emitters which are each connected to an auxiliary potential H1, H2, H3, H4 and bases which are connected to the emitters of the transistors T15, T16, T26, T27, are connected on the collector side to the bases of the transistors T17, T18, T28, T29. A resistor R36 is connected between the emitters of the pnp transistors T21 and T22, and a resistor R37 is connected between the emitters of the pnp transistors T32 and T33. Respective resistors R14, R15, R27, R26 are connected between the negative supply potential GND and the emitters of the transistors T19, T20, T30, T31.

In a further feature of the invention, both trigger stages are provided with respective pnp transistors T23, T24, and T34, T35, having emitters which are connected to the positive supply potential VCC and bases which are each connected to one another. The collectors of the transistors T24 and T35 are respectively coupled to the bases of the transistors T15 and T26. The collectors of the npn transistors T25 and T36 are connected to the positive supply potential VCC and the bases thereof are respectively connected to the collector and the base of the transistors T23 and T34. The emitters of the transistors T25 and T36 are each connected to the negative supply potential GND through a respective current source. In this case, each of the current sources are provided by one respective npn transistor T54 or T50. The emitters of the npn transistors T54 and T50 are respectively connected through resistors R33 and R29 to the negative supply potential GND. The respective additional configurations having the transistors T23, T24, T25, T54 and T34, T35, T36, T50 have the effect of ensuring that the base current of the transistors T15 and T26 is virtually completely compensated for.

Additionally, one of the two trigger stages is fed back by means of a resistor R16. To this end, the resistor R16 is connected between the bases of the transistors T15 and T16. The fed-back trigger stage is triggered with a signal at the control input FMO, which is carried to the base of the transistor T15. The signal at the control input FMO serves the purpose of frequency modulation for the oscillator. In contrast, the non-fed-back trigger stage is acted upon by a signal at the control input FTU, which is applied to the base of the transistor T26. The signal at the control input FTU serves to adjust the oscillator stage.

In a feature of the invention, in addition to output signals A1 and A2, which are picked up at the emitters of the transistors T5 and T6, further output signals A3 and A4 are provided, which are picked up at the collectors of the transistors T7 and T8. To this end, respective resistors R17 and R18 are connected between the positive supply potential VCC and the collectors of the transistors T7 and T8. For instance, the output signals A3 and A4, which are symmetrical to one another, may be provided for triggering a following frequency divider. In this connection it should be noted that, in the event that an asymmetrical signal is needed, only one of the two output signals A3 and A4 should be used. In that case, one of the two resistors R17 and R18 can be dispensed with, and the collector of the applicable transistor T7 or T8 can be applied directly to the positive supply potential VCC. The output signals A1 and A2, that are respectively buffered by means of emitter followers including the transistors T5, T42, R24 and T6, T41, R19 are, for instance, provided for triggering a transmission end stage. The various current sources are combined into a total of three current banks. A first current bank has an npn transistor T56 with a collector which is connected to the positive supply potential VCC and a base which is acted upon by a bias potential B1. An npn transistor T55, which has an emitter that is connected through a resistor R34 to the negative supply potential GND, is coupled on one hand on the collector side to the base of the transistor T56 and on the base side to the emitter of the transistor T56, and to the bases of the transistors T52, T53 and T54. A second current bank has an npn transistor T49, with a collector which is connected to the positive supply potential VCC and a base which is acted upon by a bias potential B2. An npn transistor T51, having an emitter which is connected to the negative supply potential GND through a resistor R30, is connected on the collector side to the base of the transistor T49 and on the base side to the emitter of the transistor T49 and and to the bases of the transistors T41, T42, T47, T48 and T50. A third current bank includes an npn transistor T45 which is connected on the collector side to the positive supply potential VCC and its base is connected to a bias potential B3. The collector of an npn transistor T46 is connected to the base of the transistor T45. The emitter side of the npn transistor T46 is connected to the negative supply potential GND. The base of the transistor T46 is coupled on one hand to the emitter of the transistor T45 and on the other hand, through a resistor R35, to the bases of the transistors T43 and T44. In closing it should be noted that in addition to bipolar embodiments of the oscillator circuit according to the invention, as is shown in the exemplary embodiment, MOS versions are equally possible.

What is claimed is:

1. An oscillator circuit, comprising:
   an oscillator stage including a first and a second transistor of a first conduction type having emitters being coupled to one another, collectors and bases,
   a third and a fourth transistor of the first conduction type having emitters being coupled to one another, collectors and bases,
   the bases of said first and third transistors being coupled to one other, and the bases of said second and fourth transistors being coupled to one another,
   a fifth transistor of the first conduction type having an emitter connected to the coupled bases of said first and third transistors, a collector connected to a first supply potential and a base forming a terminal,
   a frequency-determining feedback element connected to said terminal,
   a sixth transistor of the first conduction type having an emitter connected to the coupled bases of said second and fourth transistors, a collector connected to the first supply potential and a base forming another terminal for said frequency-determining feedback element,
   a first resistor connected between the collectors of said third and fourth transistors, a second resistor connected between the base of said fifth transistor and the collector of said fourth transistor, a third resistor connected between the base of said fifth transistor and the collector of said second transistor, a fourth resistor connected between the base of said sixth transistor and the collector of said third transistor, and a fifth resistor connected between the base of said sixth transistor and the collector of said first transistor,
   a seventh and an eighth transistor of the first conduction type having collectors connected to the first supply potential, emitters and bases,
   a sixth resistor connected between the emitter of said seventh transistor and the collector of said first transistor, and a seventh resistor connected between the emitter of said seventh transistor and the collector of said third transistor,
   an eighth resistor connected between the emitter of said eighth transistor and the collector of said second transistor, and a ninth resistor connected between the emitter of said eighth transistor and the collector of said fourth transistor,
   a first current source connected between a second supply potential and the emitter of said fifth transistor, and a second current source connected between the second supply potential and the emitter of said sixth transistor,
   a ninth transistor of the first conduction type having a collector connected to the first supply potential and a base connected to the bases of said seventh and eighth transistors,
   a tenth resistor connected between the first supply potential and the base of said ninth transistor,
   a tenth transistor of the first conduction type having a collector connected to the base of said ninth transistor and an emitter connected to the second supply potential,
   an eleventh, a twelfth and a thirteenth resistor connected in series between the emitter of said ninth transistor and the second supply potential, said eleventh, twelfth and thirteenth resistors having pickups therebetween,
   an eleventh and a twelfth transistor of the first conduction type having coupled collectors connected to the first supply potential and having bases, the base of said eleventh transistor being connected to a first bias potential and the base of said twelfth transistor being connected to the pickup between said twelfth and thirteenth resistors,
   a thirteenth and a fourteenth transistor of the second conduction type having emitters, collectors and bases, the emitter of said thirteenth transistor being connected to the emitter of said eleventh transistor and the emitter of said fourteenth transistor being connected to the emitter of said twelfth transistor, and a third current source connected between the second supply potential and the base and the collector of said thirteenth transistor, and a fourth current source connected between the second supply potential and the collector of said fourteenth transistor and the base of said tenth transistor; and at least one trigger stage having a first controllable current source connected between the second supply potential and the coupled emitters of said third and fourth transistors, and a second controllable current source connected between the second supply potential and the coupled emitters of said first and second transistors, said first and second controllable current sources having control inputs, a fifteenth transistor of the first conduction type having a collector connected to the first supply potential, a base forming a signal input, and an emitter, a sixteenth transistor of the first conduction type having a collector connected to the first supply potential, a base connected to the pickup between said eleventh and twelfth resistors, and an emitter, a fifth current source connected between the second supply potential and the emitter of said fifteenth transistor, and a sixth current source connected between the second supply potential and the emitter of said sixteenth transistor, a seventeenth and an eighteenth transistor of the first conduction type having coupled collectors connected to the first supply potential, having emitters each being connected to one of the control inputs of a respective one of said first and second controllable current sources, and having bases, a nineteenth transistor of the first conduction type having a collector connected to the base and a base connected to the emitter of said seventeenth transistor;

a twentieth transistor of the first conduction type having a collector connected to the base and a base connected to the emitter of said eighteenth transistor;

a twenty-first and a twenty-second transistor of the second conduction type having emitters each being connected to a respective auxiliary potential, bases each being connected to the emitter of a respective one of said fifteenth and sixteenth transistors, and collectors each being connected to the base of a respective one of said seventeenth and eighteenth transistors, and a fourteenth and a fifteenth resistor each being connected between the second supply potential and the emitter of a respective one of said nineteenth and twentieth transistors.

2. The oscillator circuit according to claim 1, including at least one twenty-third and at least one twenty-fourth transistor of the second conduction type having emitters connected to the first supply potential, bases connected to one another, and collectors, the collector of said twenty-fourth transistor being coupled to the base of said fifteenth transistor, a twenty-fifth transistor of the first conduction type having a collector connected to the first supply potential and a base connected to the collector and to the base of said twenty-third transistor, and a seventh current source connected between the emitter of said twenty-fifth transistor and the second supply potential.

3. The oscillator circuit according to claim 1, including a sixteenth resistor through which the bases of said fifteenth and sixteenth transistors are coupled to one another, in a trigger stage.

4. The oscillator circuit according to claim 1, including seventeenth and eighteenth resistors each being connected between the first supply potential and the collector of a respective one of said seventh and eighth transistors.

5. The oscillator circuit according to claim 2, wherein said first through seventh current sources are combined into at least one current bank.

* * * * *